(12) United States Patent
Adam et al.

(10) Patent No.: US 11,112,704 B2
(45) Date of Patent: Sep. 7, 2021

(54) MITIGATION OF INACCURACIES RELATED TO GRATING ASYMMETRIES IN SCATTEROMETRY MEASUREMENTS

(71) Applicant: KLA-TENCOR CORPORATION, Milpitas, CA (US)

(72) Inventors: Ido Adam, Qiriat Ono (IL); Vladimir Levinski, Migdal HaEmek (IL); Amnon Manassen, Haifa (IL); Yuval Lubashevsky, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 115 days.

(21) Appl. No.: 15/753,187

(22) PCT Filed: Dec. 15, 2017

(86) PCT No.: PCT/US2017/066853
§ 371 (c)(1),
(2) Date: Feb. 16, 2018

(87) PCT Pub. No.: WO2018/147938
PCT Pub. Date: Aug. 16, 2018

(65) Prior Publication Data
US 2019/0033726 A1    Jan. 31, 2019

Related U.S. Application Data

(60) Provisional application No. 62/457,787, filed on Feb. 10, 2017.

(51) Int. Cl.
*G03F 7/20* (2006.01)
*H04N 5/232* (2006.01)
(Continued)

(52) U.S. Cl.
CPC ......... *G03F 7/70633* (2013.01); *G02B 7/38* (2013.01); *G02B 27/32* (2013.01); *G06T 7/80* (2017.01);
(Continued)

(58) Field of Classification Search
CPC ............ G03F 7/70633; G03F 7/70683; H04N 5/23212; G02B 27/32; G02B 7/38;
(Continued)

(56) References Cited

U.S. PATENT DOCUMENTS 4,757,207 A * 7/1988 Chappelow ......... G03F 7/70633
250/491.1
5,539,446 A * 7/1996 Sullivan ............... G01B 11/272
347/262
(Continued)

FOREIGN PATENT DOCUMENTS

CN   105143986 A1   12/2015
WO   2016187468 A1  11/2016

OTHER PUBLICATIONS

ISA/KR, International Search Report for PCT/US2017/066853 dated Apr. 17, 2018.
(Continued)

*Primary Examiner* — Mohamed K Amara
(74) *Attorney, Agent, or Firm* — Hodgson Russ LLP

(57) ABSTRACT

Scatterometry overlay targets as well as target design and measurement methods are provided, which mitigate the effects of grating asymmetries in diffraction based overlay measurements. Targets comprise additional cells with sub-resolved structures replacing resolved coarse pitch gratings and/or comprise alternating sub-resolved structures with coarse pitch periodicity—to isolate and remove inaccuracies that result from grating asymmetries. Measurement methods utilize orthogonally polarized illumination to isolate the (Continued)

grating asymmetry effects in different measurement directions, with respect to the designed target structures.

7 Claims, 6 Drawing Sheets

(51) Int. Cl.
| | | |
|---|---|---|
| *G06T 7/80* | (2017.01) | |
| *G02B 7/38* | (2021.01) | |
| *G02B 27/32* | (2006.01) | |

(52) U.S. Cl.
CPC ... *H04N 5/23212* (2013.01); *H04N 5/232122* (2018.08); *H04N 5/232123* (2018.08)

(58) Field of Classification Search
CPC .. G02B 27/4255; G02B 27/4272; G06T 7/80; H01L 2924/0002; H01L 2924/00; H01L 23/544; G01B 11/272; G01B 11/14; G01B 11/2441; G01N 21/956; G01N 21/01; G01N 21/47; G01N 21/4788; G01N 21/9501; G01N 2201/068
See application file for complete search history.

(56) References Cited

U.S. PATENT DOCUMENTS

| | | | | |
|---|---|---|---|---|
| 6,023,338 A * | 2/2000 | Bareket | ............... | G03F 7/70633 257/E21.53 |
| 6,271,047 B1 * | 8/2001 | Ushio | ................... | B24B 37/013 257/E21.528 |
| 7,170,604 B2 * | 1/2007 | Sezginer | ............. | G03F 7/70633 257/797 |
| 7,193,715 B2 * | 3/2007 | Smedt | ................ | G01N 21/4788 257/797 |
| 7,230,704 B2 * | 6/2007 | Sezginer | ............. | G01N 21/4788 356/401 |
| 7,440,105 B2 * | 10/2008 | Adel | ....................... | B82Y 10/00 257/797 |
| 7,528,941 B2 * | 5/2009 | Kandel | ............... | G03F 7/70633 356/237.2 |
| 7,629,697 B2 * | 12/2009 | Van Haren | .......... | G03F 7/70633 257/797 |
| 7,633,618 B2 * | 12/2009 | Monshouwer | ......... | G01B 11/27 257/797 |
| 7,700,247 B2 * | 4/2010 | Ausschnitt | .......... | B81C 99/0065 430/30 |
| 7,772,710 B2 * | 8/2010 | Silver | ................... | H01L 23/544 257/283 |
| 8,115,938 B2 * | 2/2012 | Van Haren | ......... | G03F 7/70633 356/614 |
| 8,321,821 B2 * | 11/2012 | Ku | ...................... | G03F 7/70633 356/328 |
| 9,007,584 B2 * | 4/2015 | Li | ....................... | G03F 7/70633 356/399 |
| 9,784,690 B2 * | 10/2017 | Sapiens | ............. | G01N 21/9501 |
| 9,869,543 B2 * | 1/2018 | Bringoltz | ............. | G03F 7/70633 |
| 9,958,791 B2 * | 5/2018 | Mathijssen | ......... | G03F 7/70466 |
| 10,210,606 B2 * | 2/2019 | Pandev | .................... | G06T 7/001 |
| 10,228,320 B1 * | 3/2019 | Levinski | ................ | G06F 30/00 |
| 10,520,832 B2 * | 12/2019 | Levinski | ............. | G03F 7/70633 |
| 2001/0007498 A1 * | 7/2001 | Arai | ................... | H01L 21/67282 356/401 |
| 2002/0080364 A1 * | 6/2002 | Monshouwer | ....... | G03F 7/70633 356/508 |
| 2002/0158193 A1 * | 10/2002 | Sezginer | ............. | G03F 7/70633 250/237 G |
| 2003/0002043 A1 * | 1/2003 | Abdulhalim | ........ | G03F 7/70633 356/400 |
| 2003/0021467 A1 * | 1/2003 | Adel | ................... | G03F 7/70633 382/151 |
| 2003/0042579 A1 * | 3/2003 | Schulz | ............. | G01N 21/95607 257/629 |
| 2003/0043372 A1 * | 3/2003 | Schulz | .................. | G01N 21/956 356/327 |
| 2003/0044702 A1 * | 3/2003 | Schulz | ............... | G03F 7/70625 430/30 |
| 2003/0133102 A1 * | 7/2003 | Opsal | .................. | G01N 21/9501 356/237.1 |
| 2003/0160960 A1 * | 8/2003 | Noguchi | .............. | G01B 11/272 356/401 |
| 2003/0190793 A1 * | 10/2003 | Brill | .................... | G01N 21/4788 438/401 |
| 2003/0223630 A1 * | 12/2003 | Adel | ........................ | G03F 7/705 382/145 |
| 2003/0224261 A1 * | 12/2003 | Schulz | .................. | G01B 11/272 430/22 |
| 2004/0066517 A1 * | 4/2004 | Huang | ................. | G01N 21/956 356/509 |
| 2004/0137651 A1 * | 7/2004 | Smedt | ................ | G01N 21/4788 438/16 |
| 2004/0246482 A1 * | 12/2004 | Sezginer | ........... | G01N 21/4788 356/401 |
| 2005/0012928 A1 * | 1/2005 | Sezginer | ................ | G01J 3/2823 356/401 |
| 2005/0195398 A1 * | 9/2005 | Adel | .................... | G03F 7/70683 356/401 |
| 2006/0204073 A1 | 9/2006 | Ghinovker et al. | | |
| 2007/0008533 A1 * | 1/2007 | Ghinovker | ........... | G01B 11/272 356/401 |
| 2007/0105029 A1 * | 5/2007 | Ausschnitt | .......... | B81C 99/0065 430/30 |
| 2007/0229829 A1 | 10/2007 | Kandel et al. | | |
| 2007/0279630 A1 * | 12/2007 | Kandel | ............... | G03F 7/70633 356/401 |
| 2008/0142998 A1 * | 6/2008 | Silver | ................... | H01L 23/544 257/797 |
| 2011/0032535 A1 * | 2/2011 | Liesener | ............ | G01B 9/02057 356/511 |
| 2011/0229830 A1 * | 9/2011 | Bhattacharyya | .... | G03F 7/70625 430/325 |
| 2011/0249244 A1 * | 10/2011 | Leewis | .................... | G03F 7/706 355/27 |
| 2013/0342831 A1 * | 12/2013 | Levinski | ................ | G01N 21/47 356/237.1 |
| 2014/0151733 A1 * | 6/2014 | Koike | ................... | H01L 33/005 257/98 |
| 2015/0138555 A1 * | 5/2015 | Dai | ..................... | G03F 7/70633 356/401 |
| 2015/0204664 A1 | 7/2015 | Bringoltz et al. | | |
| 2015/0219449 A1 * | 8/2015 | Bringoltz | ............. | G01B 11/272 356/614 |
| 2015/0233705 A1 | 8/2015 | Bringoltz et al. | | |
| 2016/0093573 A1 * | 3/2016 | Liou | .................... | G03F 7/70633 257/741 |
| 2018/0031470 A1 * | 2/2018 | Levinski | ................ | G01N 21/00 |
| 2018/0157784 A1 * | 6/2018 | Levinski | ............... | H01L 21/027 |

OTHER PUBLICATIONS

CNIPA, First Office Action for CN Application No. 201780086130.3, dated May 20, 2021.

* cited by examiner

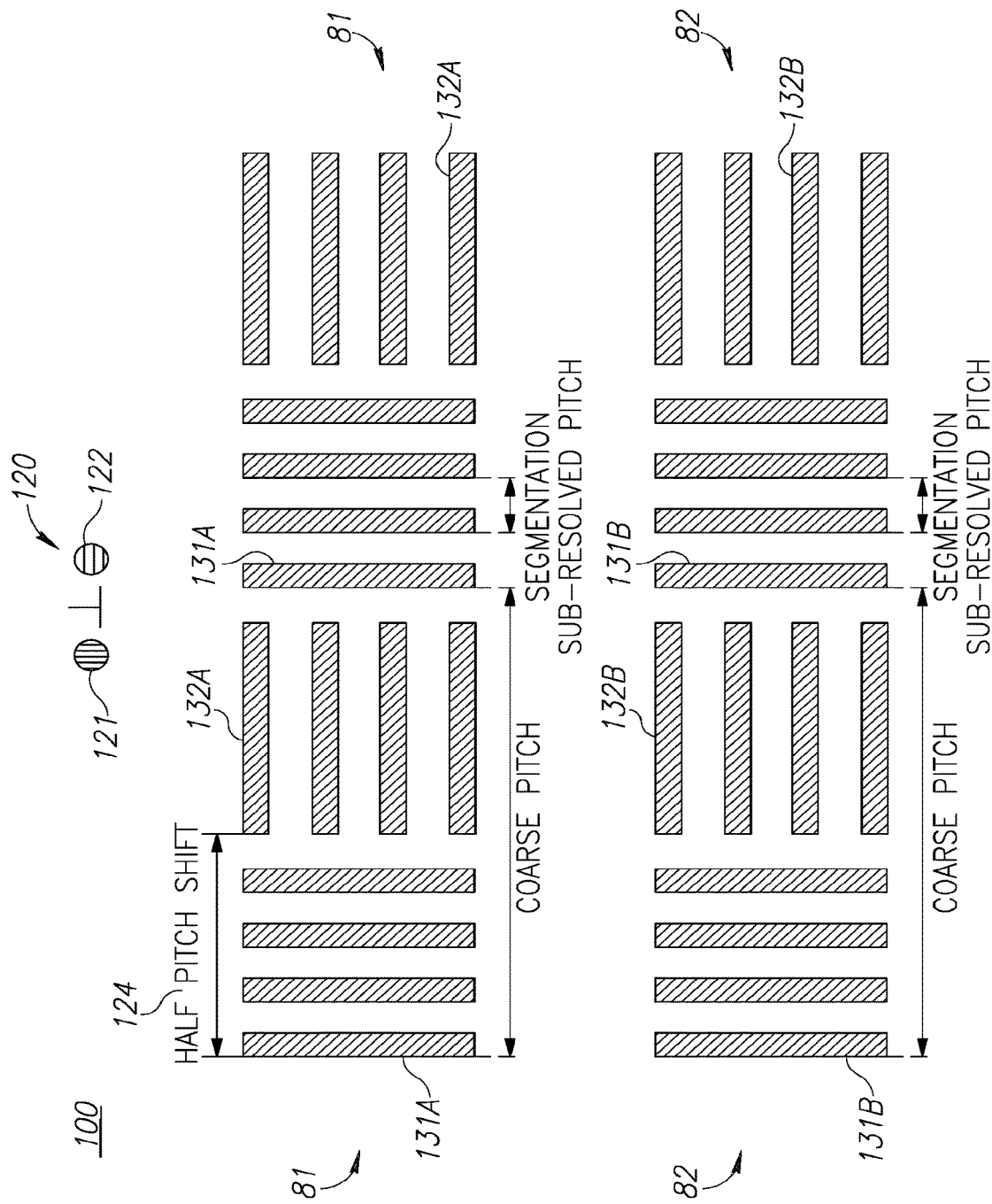

MITIGATION OF INACCURACIES RELATED TO GRATING ASYMMETRIES IN SCATTEROMETRY MEASUREMENTS

CROSS REFERENCE TO RELATED APPLICATIONS

This application claims the benefit of U.S. Provisional Patent Application No. 62/457,787 filed on Feb. 10, 2017, which is incorporated herein by reference in its entirety.

BACKGROUND OF THE INVENTION

1. Technical Field

The present invention relates to the field of metrology, and more particularly, to scatterometry overlay targets and measurement methods therefor.

2. Discussion of Related Art

Current diffraction-based overlay (DBO) marks, or targets, are composed of cells having two gratings, one grating in each layer, which are to be aligned. The diffracted signals from these cells are used to compute the displacement (the overlay) between the two layers. Measured asymmetries in the aforementioned cells are used to estimate the displacement of one grating with respect to the other.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides SCOL (scatterometry overlay) targets comprising, along at least one measurement direction: two cells having periodic structures with a specified coarse pitch at least at two wafer layers, wherein the two cells have opposite offsets of a top periodic structure with respect to a bottom periodic structure in the respective layers, and two cells having, each, a periodic structure with the specified coarse pitch at a different one of the two layers and a sub-resolved periodic structure at the other one of the two layers.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 3 is a high-level schematic illustration of metrology targets, according to some embodiments of the invention.

DETAILED DESCRIPTION OF THE INVENTION

Figure 1:
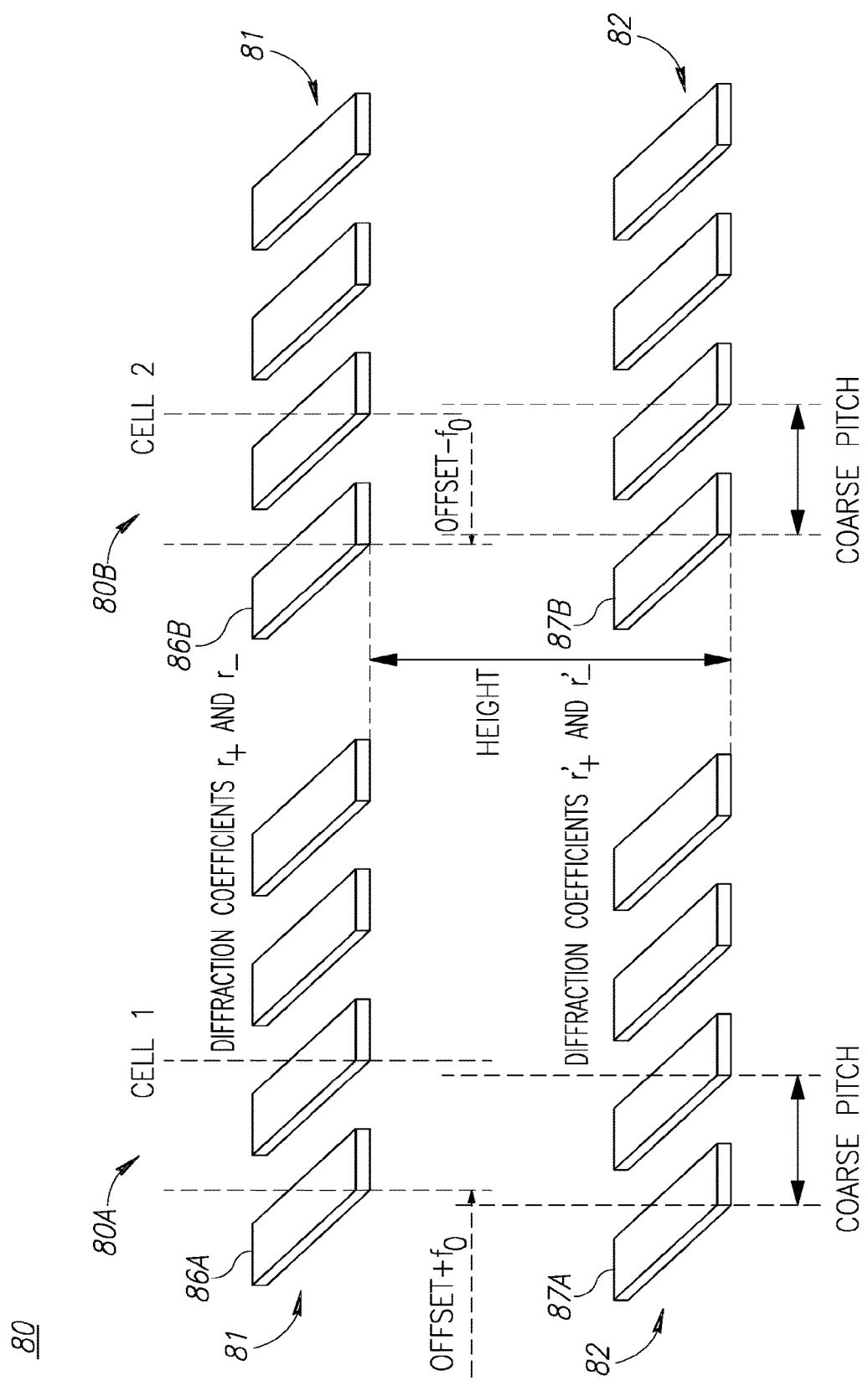
FIG. 1 is a high-level schematic illustration of a scatterometry target with grating asymmetries, presenting sections of two cells of the target, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanism for mitigating the effects of grating asymmetries in DBO (diffraction based overlay) measurements and thereby provide improvements to the technological field of overlay scatterometry metrology. Improved overlay target designs and measurement techniques are provided, which to mitigate the effect of target grating asymmetries. Grating asymmetries arise due to the nature of the manufacturing process, and are unaccounted for by current methods which assume that the asymmetries originate strictly from the displacement between the layers (overlay plus intended offsets), and consequentially, any additional asymmetry in the grating is wrongly interpreted in the prior art as an additional displacement, leading to an inaccurate measurement of the overlay. The inventors have found out ways to characterize and prevent overlay estimation inaccuracies which are due to grating asymmetries.

Scatterometry overlay targets as well as target design and measurement methods are provided, which mitigate the effects of grating asymmetries in diffraction based overlay measurements. Targets comprise additional cells with sub-resolved structures replacing resolved coarse pitch gratings and/or comprise alternating sub-resolved structures with coarse pitch periodicity—to isolate and remove inaccuracies that result from grating asymmetries. Measurement methods utilize orthogonally polarized illumination to isolate the grating asymmetry effects in different measurement directions, with respect to the designed target structures.

FIG. 1 is a high-level schematic illustration of scatterometry target 80 with grating asymmetries, presenting sections of two cells 80A, 80B of target 80, according to some embodiments of the invention.

Illustrated grating-over-grating system 80 comprises periodic structures 86A, 87A, 86B, 87B in at least two layers 81, 82 of corresponding target cells 80A, 80B. Periodic structures in each cell are displaced by $\Delta$=offset+overlay relative to each other, the displacement comprising intended offsets which are opposite between cells 80A, 80B (indicated in FIG. 1 as $+f_0$) and the overlays which are to be measured by the metrology measurements (not shown explicitly in FIG. 1). Gratings 86A, 86B and 87A, 87B in layers 81 and 82, respectively, are separate by a height indicated as h. In the presence of grating asymmetries in the top and/or the bottom gratings, the diffraction coefficients of the +1 and −1 orders of the measured metrology signals are not equal. Denoting the diffraction coefficients of the +1 and −1 orders of the top grating as $r_+$ and $r_-$, respectively, and those of the bottom grating $r_+'$ and $r_-'$. Because of grating asymmetries, the diffraction coefficients may differ in both amplitude and phase, and are therefore expressed in the form $r_{\pm 1}=(\rho\pm\delta\varphi)e^{i(\psi\pm\delta\psi)}$ for the top grating and $r'_{\pm 1}=(\rho'\pm\delta\rho')e^{i(\psi'\pm\delta\psi')}$ for the bottom grating. Equations 1 present the intensity of the +1 and −1 diffraction order signals in the presence of a grating asymmetry, neglecting multiple scattering effects. The expression $\phi_m(x,y)$ provides the leading order for the phase accrued by the $m^{th}$ order due to the optical path difference between the two gratings.

$$I_{+1}(x,y) = |E_0|^2 \begin{bmatrix} (\rho+\delta\rho)^2 + (\rho'+\delta\rho')^2 + 2(\rho+\delta\rho)(\rho'+\delta\rho') \times \\ \cos\left(\psi-\psi'+\delta\psi-\delta\psi'-\phi_0(x,y)-\phi_{+1}(x,y)+\frac{2\pi\Delta}{P}\right) \end{bmatrix}$$

$$I_{-1}(-x,-y) = |E_0|^2 \begin{bmatrix} (\rho-\delta\rho)^2 + (\rho'-\delta\rho')^2 + 2(\rho-\delta\rho)(\rho'-\delta\rho') \times \\ \cos\left(\psi-\psi'-\delta\psi+\delta\psi'-\phi_0(x,y)-\phi_{+1}(x,y)-\frac{2\pi\Delta}{P}\right) \end{bmatrix}$$

Equations 1

$$\phi_m(x,y) = \frac{2\pi h}{\lambda}\sqrt{n^2 - \left(x+\frac{m\lambda}{P}\right)^2 - y^2}$$

Equation 2 expresses the differential signal $D(x,y)=I_{+1}(x,y)-I_{-1}(-x,-y)$, with the phase defined as $\Phi(x,y)=\psi-\psi'-\phi_0(x,y)-\phi_{+1}(x,y)$.

$$D(x,y) = 4|E_0|^2 \Big[\rho\delta\rho + \rho'\delta\rho' - \qquad \text{Equation 2}$$
$$2(\rho\rho'+\delta\rho\delta\rho')\sin\Phi(x,y)\sin\left(\frac{2\pi\Delta}{P}+\delta\psi-\delta\psi'\right)+$$
$$2(\rho\delta\rho'+\rho'\delta\rho)\cos\Phi(x,y)\cos\left(\frac{2\pi\Delta}{P}+\delta\psi-\delta\psi'\right)\Big]$$

Equation 3 provides an approximation for the differential signal of Equation 2 under the following assumptions: (i) The contribution of the phase perturbations $\delta\psi-\delta\psi'$ to the overlay accuracy budget is negligible as it is much smaller than the contribution of the amplitude perturbation described by $\delta\rho$ and $\delta\rho'$, as the phase perturbations are within the geometrical ambiguity range which corresponds to the uncertainty in definition of center of symmetry for slightly asymmetric target; (ii) The measurement conditions (wavelength, polarization as an example) may be chosen to make the phase $\Phi(x,y)$ close to $\pi/2\pm\pi n$, with integer n—to minimize the term $$2(\rho\delta\rho'+\rho'\delta\rho)\cos\Phi(x,y)\cos\left(\frac{2\pi\Delta}{P}+\delta\psi-\delta\psi'\right),$$

depending on $\cos\Phi(x,y)$, to negligible size and approximating $\sin\Phi(x,y)$ as 1; and (iii) Approximating the differential signal to the leading order (neglecting the terms in the order of magnitude of $\Theta(\delta\rho\delta\rho')$).

$$D(x,y) = 4|E_0|^2\left[\rho\delta\rho+\rho'\delta\rho' - 2\rho\rho'\sin\left(\frac{2\pi\Delta}{P}\right)\right] \qquad \text{Equation 3}$$

Equation 3 demonstrates that the differential signal deviates from the ideal signal assumed by prior art overlay measurement algorithms, and introduces an additional inaccuracy into the overlay estimations. The inventors point out that in Equation 3, the term $$2\rho\rho'\sin\left(\frac{2\pi\Delta}{P}\right)$$

provides a basis for the overlay measurement through the estimation of $\Delta$, while the terms $\rho\delta\rho+\rho'\delta\rho'$ provide an estimation for the overlay measurement inaccuracy due, e.g., to grating asymmetries. In the following, the inventors present ways to take into account the grating asymmetries which remain unaccounted for in the prior art.

Figure 2A:
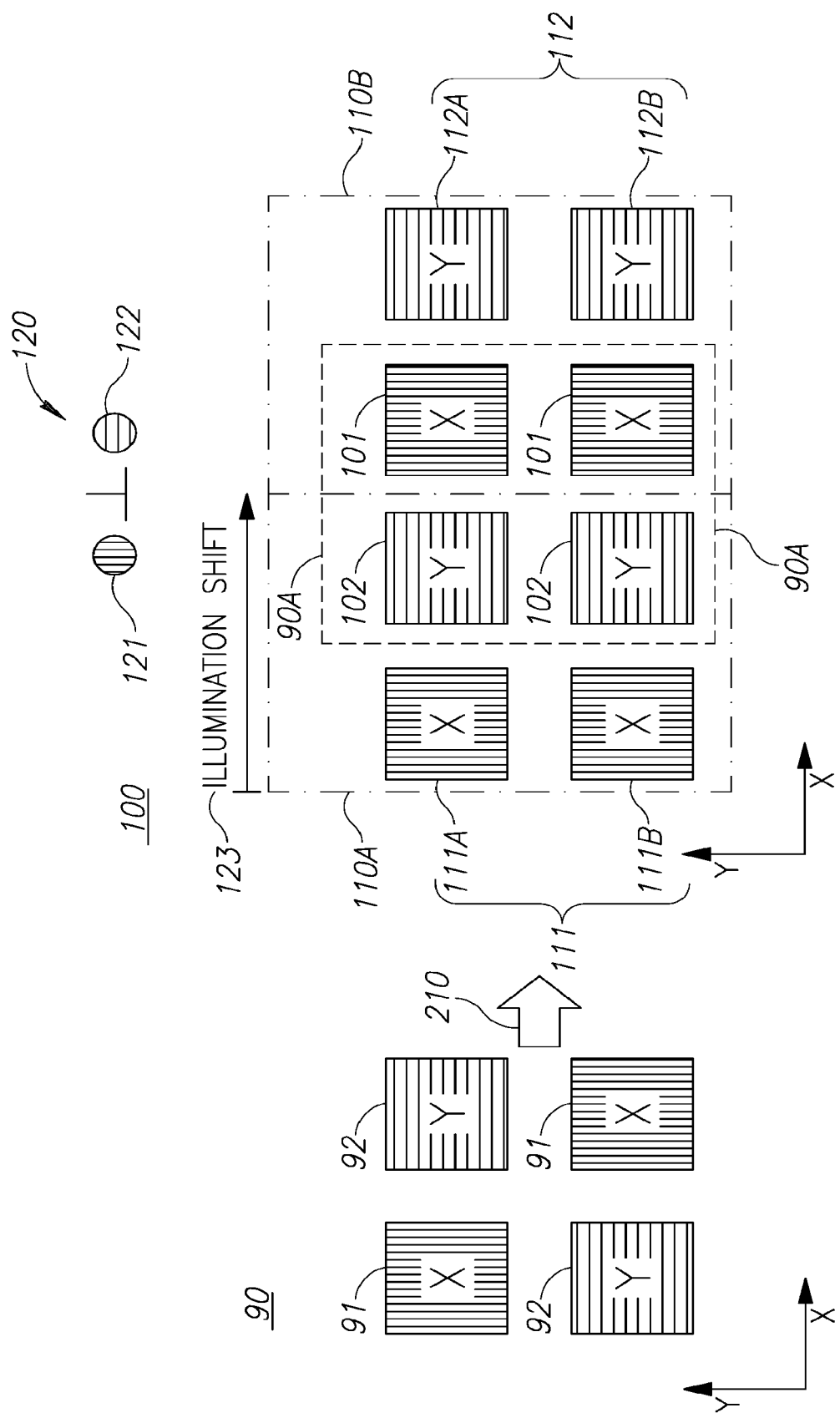
FIG. 2A is a high-level schematic illustration of metrology targets, their derivation from prior art targets, and measurement configurations, according to some embodiments of the invention.

FIG. 2A is a high-level schematic illustration of metrology targets 100, their derivation from prior art targets 90, and measurement configurations, according to some embodiments of the invention. The following solutions handle the inaccuracies introduced e.g., by grating asymmetries, which were derived above and presented in Equation 3. Prior art targets 90 are represented schematically as having two cells in each measurements direction, cells 91 in measurement direction X and cells 92 in measurement direction Y, with each pair of cells designed according to the principles described in FIG. 1 for cells 80A, 80B having periodic structures with opposite designed offsets between the layers in each cell.

In certain embodiments, disclosed targets 100 comprise cell pairs 101, 102 in respective X and Y measurement directions designed as in prior art targets 90—and additional two pairs 111 and 112, with cells 111A, 111B and 112A, 112B in each measurement direction X and Y respectively (the addition is indicated by arrow 210, see FIG. 5 below).

Figure 2B:
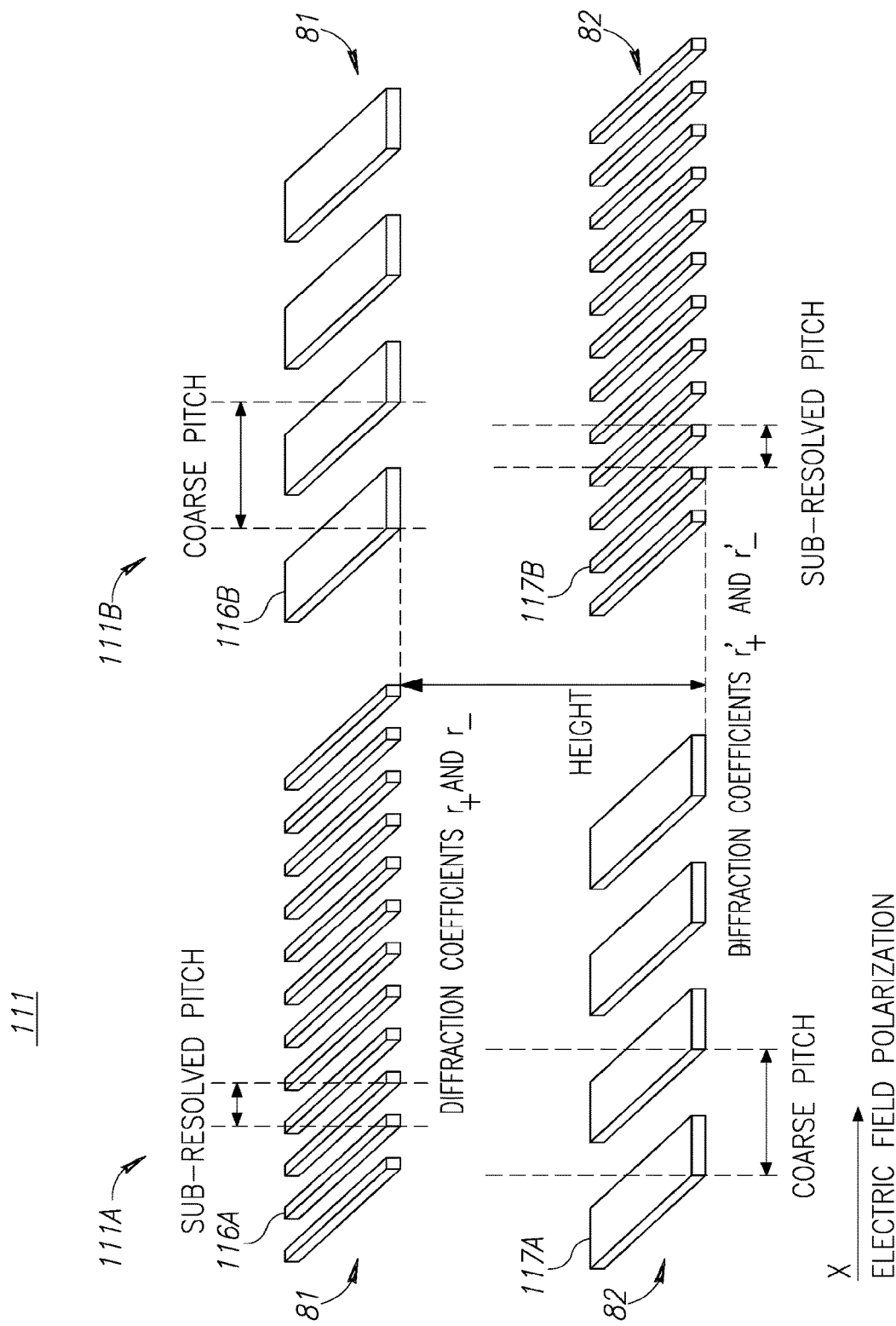
FIG. 2B is a high-level schematic illustration of an additional pair of cells in the metrology targets, according to some embodiments of the invention.

FIG. 2B is a high-level schematic illustration of additional pair 111 of cells in metrology targets 100, according to some embodiments of the invention. In each pair 111 of cells, in one cell (e.g., 111A in the X direction) the top grating is replaced by an appropriately designed sub-resolved grating 116A; and in the other cell (e.g., 111B in the X direction), the bottom structure is replaced by a different appropriately designed sub-resolved structure 117B. Measurements of these two cells allow the correction of inaccuracies due to asymmetries in the grating in the following way. To the leading order the signal returning from a grating-over-grating is given by the single-scattering model, i.e. by the interference of the light diffracted from top grating with the light diffracted from the bottom grating. It can be shown that the differential signal of cell 111A with only bottom grating 117A is $D(x,y)=4|E_0|^2 \rho' \delta \rho'$ and that the differential signal of cell 111B with only top grating 116B is $D(x,y)=4|E_0|^2 \rho \delta \rho$. Therefore, the additional cells provide an estimation of the inaccuracies resulting from grating asymmetry independently from the measurements of cells 101 of target 100. Subtracting the inaccuracy estimations from cells 111 from the non-ideal differential signal derived from cells 101 therefore removes the first and second terms $\rho \delta \rho + \rho' \delta \rho'$ of Equation 3, which deviate from the signal in the absence of asymmetries. The third term $$2\rho\rho' \sin\left(\frac{2\pi\Delta}{P}\right)$$

can then be minimized by picking a wavelength far from a resonance, leaving a signal close to the ideal one assumed by the algorithm. Similar cells 112 (112A, 112B, corresponding to 111A, 111B, in the Y measurement direction) and measurements may be applied to the Y measurement direction as well, with respect to measurements of cells 102.

As illustrated schematically in FIG. 2B, sub-resolved gratings 116A, 117B in cells 111A, 111B, respectively, comprise periodic structure(s) with sub-resolved pitches, e.g., pitch below 300 nm, 200 nm or below 100 nm (as non-limiting example for typical device pitches). Sub-resolved gratings 116A, 117B may be configured to maintain the optical properties of the stack in cells 111 and 112 identical, similar, or with a controlled difference with respect to cells 101, 102 having periodic structures with coarse, resolved pitches (e.g., above 500 nm) both layers 81, 82. Sub-resolved structures 116A, 117B may be configured to replace gratings 86A, 87B (see FIG. 1) with respect to the optical properties of the stack. For example, using illumination radiation which is polarized parallel to the target lines (the elements of periodic structures 117A, 116B), sub-resolved periodic structures 116A, 117B may be configured to have the same filling factor as the original target periodic elements 86A, 87B—to provide the same effective permittivity for cells 111, 112 as for cells 101, 102, namely $\varepsilon_{\mathit{eff}}=\varepsilon_1 \cdot \eta + \varepsilon_2 \cdot (1-\eta)$, with $\varepsilon_1$ denoting the grating material permittivity, $\varepsilon_2$ denoting the surrounding material permittivity and $\eta$ denoting the filling factor. In the case of electric field directed perpendicular to the grating lines, the effective medium approximation is $$\varepsilon_{\mathit{eff}} = \frac{\varepsilon_1 \cdot \varepsilon_2}{\varepsilon_1 \cdot (1-\eta_1) + \varepsilon_2 \cdot \eta_1}$$

so that the corresponding filling factor ($\eta_1$) for grating(s) 116A, 117B replacing the original target gratings 86A, 87B, respectively, should satisfy the condition:

$$\frac{\varepsilon_1 \cdot \varepsilon_2}{\varepsilon_1 \cdot (1-\eta_1) + \varepsilon_2 \cdot \eta_1} = \varepsilon_1 \cdot \eta + \varepsilon_2 \cdot (1-\eta) \Rightarrow \eta_1 = \eta \frac{\varepsilon_1}{\varepsilon_1 \cdot \eta + \varepsilon_2 \cdot (1-\eta)},$$

which, however, cannot be satisfied for any wavelength.

Accordingly, targets 111, 112 with periodic structures in the X and Y directions, respectively, may be measured with orthogonal polarizations 121, 122, respectively of illumination radiation 120, as indicated schematically in FIG. 2A. Measurements may be carried out using two independent channels corresponding to orthogonal polarizations (the corresponding illumination spots are shown schematically by circles 121, 122).

In certain embodiments, targets 100 may be configured, e.g., with respect to the spatial arrangement of cells 101, 102, 111, 112, to have groups of cells, denoted e.g., by 90A, 110A, 110B, which correspond to the spatial arrangement of cells 91, 92 in prior art targets 90. In such configurations, group (target part) 90A may correspond in its spatial organization to prior art targets 90, as may groups (target parts) 110A, 110B. Moreover, in certain embodiments, such target configurations may be configured to allow and to be measured utilizing simultaneous measurement of two cells using two illumination spots 120 with corresponding polarizations, for example, measuring additional single grating X cell with Y polarization (e.g., cell 111A with illumination spot 122) and grating on grating Y cell with X polarization (e.g., cell 102 with illumination spot 121). In certain embodiments, targets 100 may be configured to have recurring groups (target parts) 110A, 110B, having similar spatial arrangement of cells 111, 102 and 101, 112, respectively, so that analogous target parts 110A, 110B may be measured sequentially by shifting the illumination field from one to the other (illustrated schematically by an arrow denoted illumination shift 123)—so that the resulting 8-cell target 100 (including additional cells 111, 112) can be measured (using two illumination spots 121, 122) during the same time as prior art target 90 is measured using one measurement spot. simplifying the measurement procedures and minimizing the operational changes with respect to measuring prior art targets 90.

To summarize, in certain embodiments, SCOL target 100 may comprise, along at least one measurement direction, two cells 101 (and/or 102) having periodic structures 86A, 86B and 87A, 87B with a specified coarse pitch at least at two wafer layers 81, 82, respectively. Cells 101 (and/or 102) may have opposite offsets $\pm f_0$ of top periodic structure(s) 86A, 86B with respect to bottom periodic structure(s) 87A, 87B in the respective layers (as illustrated schematically e.g., in FIG. 1), and two cells 111 (and/or 112) having, each, periodic structure(s) 116B, 117A with the specified coarse pitch at a different one of the two layers 81, 82 and sub-resolved periodic structure(s) 116A, 117B at the other one of the two layers, 82, 81, respectively (as illustrated schematically e.g., in FIG. 2B). Four cells 101, 111 (and/or 102, 112) may be designed along each of two, X and Y, measurement directions, duplicating the scheme described above to both directions X (with four cells 101, 111) and Y (with four cells 102, 112), as illustrated schematically, e.g., in FIG. 2A. In certain embodiments, eight cells (two in each of cells 101, 102, 111, 112) may be arranged in two groups 110A, 110B of four cells each—two X direction cells and two Y direction cells (e.g., 111, 102 in one group, 101, 112 in another group, respectively—see FIG. 2A)—having a same spatial arrangement with respect to the measurement directions. Target design files 99 of any of disclosed targets 100 are likewise part of the present disclosure.

Advantageously, addition of cells 111, 112 with sub-resolved periodic structures allows to compensate for the inaccuracies due to grating asymmetries and improves the accuracy with respect to standard DBO techniques. The use of sub-resolved structures 116A, 117B instead of gratings 86A, 87B in the two additional cells makes sure that the film stack properties are unmodified leading to a better cancellation of the terms that deviate from the ideal signal and hence leading to better overlay accuracy.

FIG. 3 is a high-level schematic illustration of metrology targets 100, according to some embodiments of the invention. Targets 100 comprise at least two layers 81, 82, each with periodic structures along alternating measurement directions X, Y—periodic structures 131A, 132A along measurement directions X, Y, respectively in layer 81 and periodic structures 131B, 132B along measurement directions X, Y, respectively in layer 82—with each periodic structure segmented at an unresolved pitch (e.g., pitch below 300 nm, 200 nm or below 100 nm—as non-limiting example for typical device pitches) and with the periodic structures alternating at a coarse pitch (e.g., between 600-1000 nm). The coarse pitch is configured to be well resolved by the metrology tool, while the sub-resolved segmentation pitch is uniform through target 100 (in both directions X and Y) and is below the resolution threshold of the metrology tool.

Targets 100 may be designed to provide the same amplitudes of the first diffraction orders, while providing the phases of the first diffraction orders at a half pitch shift 124 of 7E between illumination radiation at two orthogonal polarization directions 121, 122 (shift 124 by pitch/2 is equivalent to a phase shift of it). Accordingly, the change of polarization changes the sign of the term $$2\rho\rho'\sin\left(\frac{2\pi\Delta}{P}\right)$$

in Equation 3 (copied below for convenience) for the differential signal D(x,y) (with respect to the first and second terms $\rho\delta\rho+\rho'\delta\rho'$ of Equation 3), whereas the scattering on target asymmetries is only slightly dependent on the changes of polarization (since the most asymmetry is formed not within the segmented parts of target 100 because the sub-resolved segmentation can be designed with minimal design rule pitch and the asymmetric disturbance is an incompact object characterized by a large coarse pitch).

$$D(x, y) = 4|E_0|^2\left[\rho\delta\rho + \rho'\delta\rho' - 2\rho\rho'\sin\left(\frac{2\pi\Delta}{P}\right)\right] \quad \text{Equation 3}$$

Consequentially, targets 100 designed (in both layers 81, 82) according to the principles illustrated in FIG. 3 and measured accordingly, to yield half the sum of the overlay values calculated for the two orthogonal polarizations is free of target asymmetry effects.

To summarize, in certain embodiments, SCOL target 100 may comprise at least at two wafer layers 81, 82, periodic structures 131A, 131B, 132A, 132B having a sub-resolved pitch, which alternate in a corresponding measurement direction to yield a coarse pitch, as illustrated schematically in FIG. 3. Target design files 99 of any of disclosed targets 100 are likewise part of the present disclosure.

Advantageously, targets 100 may be configured and measured to eliminate target asymmetry effects, and embodiments of targets 100 which are designed according to the principles illustrated in FIG. 3 require smaller target areas than targets 100 designed according to the principles illustrated in FIG. 2A.

Figure 4:
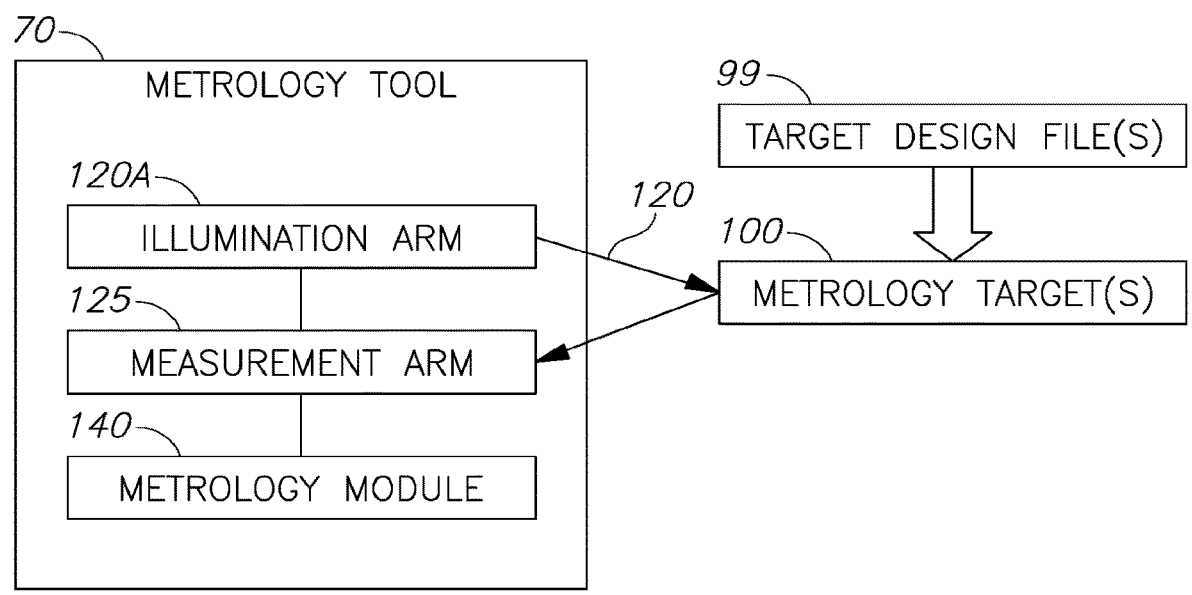
FIG. 4 is a high-level schematic illustration of a metrology measurement setting, according to some embodiments of the invention.

FIG. 4 is a high-level schematic illustration of a metrology measurement setting, according to some embodiments of the invention. A metrology tool 70 typically has an illumination arm 120A delivering illumination radiation 120 onto metrology target 100 (which is produced using target design file(s) 99) and a measurement arm 125 measuring the resulting signal, in case of SCOL targets 100—the diffractions orders (typically orders 0, −1 and +1, in the pupil plane) of the radiation scattered off target 100. A metrology module 140 receives the measured signals and processes them to derive metrology metric(s) such as the overlay between target layers 81, 82, as disclosed herein.

Figure 5:
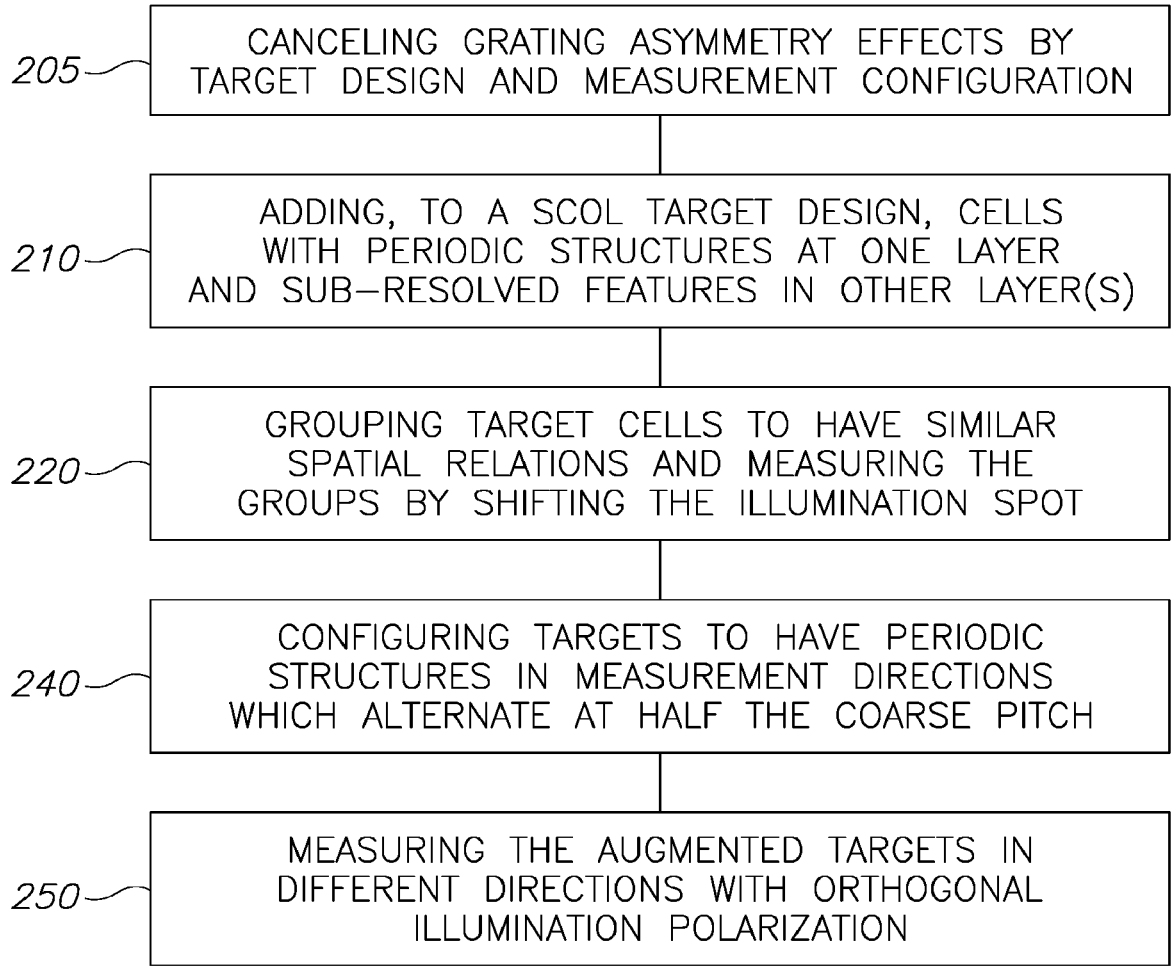
FIG. 5 is a high-level flowchart illustrating a method, according to some embodiments of the invention.

FIG. 5 is a high-level flowchart illustrating a method 200, according to some embodiments of the invention. The method stages may be carried out with respect to targets 100 described above, which may optionally be configured to allow implementation of method 200. Method 200 may be at least partially implemented, in its designing and/or measuring aspects, by at least one computer processor, e.g., in metrology module 140. Certain embodiments comprise computer program products comprising a computer readable storage medium having computer readable program embodied therewith and configured to carry out the relevant stages of method 200. Certain embodiments comprise target design files of respective targets designed by embodiments of method 200 and/or measurement results of method 200. Method 200 may comprise the following stages, irrespective of their order.

Method 100 may comprise cancelling grating asymmetry effects by target design and measurement configuration (stage 205), as disclosed herein.

In certain embodiments, method 200 may comprise adding, to a SCOL target design, cells with periodic structures at one layer and sub-resolved features in other layer(s) (stage 210), as illustrated schematically in FIG. 2A. In certain embodiments, method 200 may comprise adding, to a SCOL target comprising, along at least one measurement direction, two cells having periodic structures with a specified coarse pitch at least at two wafer layers, wherein the two cells have opposite offsets of a top periodic structure with respect to a bottom periodic structure in the respective layers—two cells having, each, a periodic structure with the specified coarse pitch at a different one of the two layers and a sub-resolved periodic structure the other one of the two layers. The SCOL target may have the two cells along each of two, X and Y, measurement directions, and adding 210 may be carried out accordingly for the cells of each of the measurement directions.

In certain embodiments, method 200 may comprise grouping target cells to have similar spatial relations and measuring the groups by shifting the illumination spot (stage 220), as illustrated schematically in FIG. 2A. In certain embodiments, method 200 may comprise arranging the eight cells in two groups of four cells each—two X direction cells and two Y direction cells, the groups having a same spatial arrangement with respect to the measurement directions.

Method 200 may further comprise measuring the augmented SCOL targets (e.g., the SCOL targets with added cells as disclosed above) and/or cells thereof in different directions with orthogonal illumination polarization (stage 250), e.g., measuring the cells along the two, X and Y, measurement directions with orthogonally polarized illumination radiation 120. The measuring may be carried out simultaneously for pairs of periodic structures with pairs of orthogonally polarized illumination spots.

The coarse pitches may be at least 500 nm or 600 nm and the sub-resolved periodic structure may have sub-resolved pitches smaller than 300 nm, 200 nm or smaller than 100 nm.

In certain embodiments, method 200 may comprise configuring targets to have periodic structures in measurement directions which alternate at half the coarse pitch (stage 240) and measuring the augmented targets in different directions with orthogonal illumination polarization (stage 250). For example, method 200 may comprise measuring, with orthogonally polarized illumination radiation along two measurement directions, a target comprising, at least at two wafer layers, periodic structures having a sub-resolved pitch which alternate in the corresponding measurement direction to yield a coarse pitch. The measuring may be carried out simultaneously for pairs of periodic structures with pairs of orthogonally polarized illumination spots.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A scatterometry overlay (SCOL) target comprising, along at least one measurement direction:
    two cells having periodic structures with a specified coarse pitch at least at a first wafer layer and a second wafer layer, wherein the first wafer layer is disposed over the second wafer layer, wherein the two cells have opposite offsets of a top periodic structure with respect to a bottom periodic structure in the respective layers, wherein a first of the two cells has a periodic structure with the specified coarse pitch at the first wafer layer and a sub-resolved periodic structure at the second wafer layer, and wherein a second of the two cells has a periodic structure with the specified coarse pitch at the second wafer layer and a sub-resolved periodic structure at the first wafer layer, wherein the specified coarse pitch is at least 500 nm and the sub-resolved periodic structure has a sub-resolved pitch smaller than 300 nm, wherein the sub-resolved periodic structure in the first of the two cells is configured to have a same filling factor as the periodic structure with the specified coarse pitch in the first of the two cells, and wherein the sub-resolved periodic structure in the second of the two cells is configured to have a same filling factor as the periodic structure with the specified coarse pitch in the second of the two cells, wherein the periodic structures have cells along each of two, X and Y, measurement directions, wherein eight of the cells are arranged in two rows each with four of the cells having a same spatial arrangement with respect to the measurement directions, wherein each of the rows comprises two X direction cells and two Y direction cells that individually alternate along the row such that one of the X direction cells in the row is adjacent two of the Y direction cells in the row and such that one of the Y direction cells in the row is adjacent two of the X direction cells in the row.

2. The SCOL target of claim 1, wherein the sub-resolved pitch is smaller than 100 nm.

3. A target design file of targets designed according to claim 1.

4. A method comprising adding, to a scatterometry overlay (SCOL) target comprising, along at least one measurement direction, two cells having periodic structures with a specified coarse pitch at least at a first wafer layer and a second wafer layer, wherein the first wafer layer is disposed over the second wafer layer, wherein the two cells have opposite offsets of a top periodic structure with respect to a bottom periodic structure in the first wafer layer and the second wafer layer, wherein one of the two cells has a periodic structure with the specified coarse pitch at the first wafer layer and a sub-resolved periodic structure at the second wafer layer and another of the two cells has a periodic structure with the specified coarse pitch at the second wafer layer and the sub-resolved periodic structure at the first wafer layer, wherein the specified coarse pitch is at least 500 nm and the sub-resolved periodic structure has a sub-resolved pitch smaller than 300 nm, wherein the sub-resolved periodic structure in the two cells is configured to have a same filling factor as the periodic structure with the specified coarse pitch in the two cells, wherein the periodic structures have cells along each of two, X and Y, measurement directions, wherein eight of the cells are arranged in two rows each with four of the cells having a same spatial arrangement with respect to the measurement directions, wherein each of the rows comprises two X direction cells and two Y direction cells that individually alternate along the row such that one of the X direction cells in the row is adjacent two of the Y direction cells in the row and such that one of the Y direction cells in the row is adjacent two of the X direction cells in the row.

5. The method of claim 4, further comprising measuring the cells along the two measurement directions with orthogonally polarized illumination radiation.

6. The method of claim 5, wherein the measuring is carried out simultaneously for pairs of cells with pairs of orthogonally polarized illumination spots.

7. The method of claim 4, wherein the sub-resolved pitch is smaller than 100 nm.

* * * * *